US011264158B2

(12) United States Patent
Sturcken et al.

(10) Patent No.: US 11,264,158 B2
(45) Date of Patent: Mar. 1, 2022

(54) ELECTROMAGNETICALLY-DRIVEN FERROMAGNETIC ACTUATOR DEVICE

(71) Applicant: Ferric Inc., New York, NY (US)

(72) Inventors: Noah Sturcken, New York, NY (US); Ryan Davies, New York, NY (US); Michael Lekas, New York, NY (US)

(73) Assignee: Ferric Inc., New York, NY (US)

( * ) Notice: Subject to any disclaimer, the term of this patent is extended or adjusted under 35 U.S.C. 154(b) by 624 days.

(21) Appl. No.: 16/184,024

(22) Filed: Nov. 8, 2018

(65) Prior Publication Data

US 2020/0152364 A1    May 14, 2020

(51) Int. Cl.
| H01F 7/06 | (2006.01) |
| H01F 7/08 | (2006.01) |
| H01F 7/126 | (2006.01) |
| H01F 7/14 | (2006.01) |
| B64C 33/02 | (2006.01) |
| H01L 23/522 | (2006.01) |
| H01L 27/092 | (2006.01) |
| H01F 7/17 | (2006.01) |
| B64C 39/02 | (2006.01) |

(52) U.S. Cl.
CPC .......... *H01F 7/064* (2013.01); *B64C 33/025* (2013.01); *H01F 7/081* (2013.01); *H01F 7/126* (2013.01); *H01F 7/14* (2013.01); *H01F 7/17* (2013.01); *H01L 23/5223* (2013.01); *H01L 23/5227* (2013.01); *H01L 27/092* (2013.01); *B64C 39/028* (2013.01); *B64C 2201/025* (2013.01); *B64C 2201/042* (2013.01)

(58) Field of Classification Search
CPC ......... H01L 2924/0002; H01L 23/5223; H01L 23/5227; H01L 27/092; H01L 27/0617; B81B 2203/0118; B81B 2201/038; B64C 33/025; B64C 39/028; B64C 2201/025; B64C 2201/042; H01F 7/081; H01F 7/064; H01F 7/126; H01F 7/14; H01F 7/17
See application file for complete search history.

(56) References Cited

U.S. PATENT DOCUMENTS 6,310,526 B1 * 10/2001 Yip .................. H01H 50/005
200/181
7,341,222 B1 * 3/2008 Reuel .................. B64C 39/028
244/11

(Continued)

*Primary Examiner* — Bernard Rojas
(74) *Attorney, Agent, or Firm* — Intrinsic Law Corp.

(57) ABSTRACT

A ferromagnetic actuator is disposed between first and second semiconductor devices that include first and second inductors. Each inductor is disposed on top of a multilevel wiring structure. Current flows through the first inductor to generate a first magnetic field that attracts the ferromagnetic actuator towards the first inductor causing the ferromagnetic actuator to transition from a first state to a second state. In the second state, a portion of the ferromagnetic actuator is disposed closer to the first inductor than it is in the first state. Current flows through the second inductor to generate a second magnetic field that attracts the ferromagnetic actuator towards the second inductor causing the ferromagnetic actuator to transition from the first or second state to a third state. In the third state, a portion of the ferromagnetic actuator is disposed closer to the first inductor than it is in the first state.

10 Claims, 10 Drawing Sheets

(56) References Cited

U.S. PATENT DOCUMENTS

| | | | |
|---|---|---|---|
| 2003/0179056 A1* | 9/2003 | Wheeler | H01H 50/005 |
| | | | 335/78 |
| 2012/0200377 A1* | 8/2012 | Lee | H01H 49/00 |
| | | | 335/179 |
| 2012/0292438 A1* | 11/2012 | Sreetharan | B64C 33/02 |
| | | | 244/72 |
| 2015/0307191 A1* | 10/2015 | Samuel | B64C 39/024 |
| | | | 244/22 |

* cited by examiner

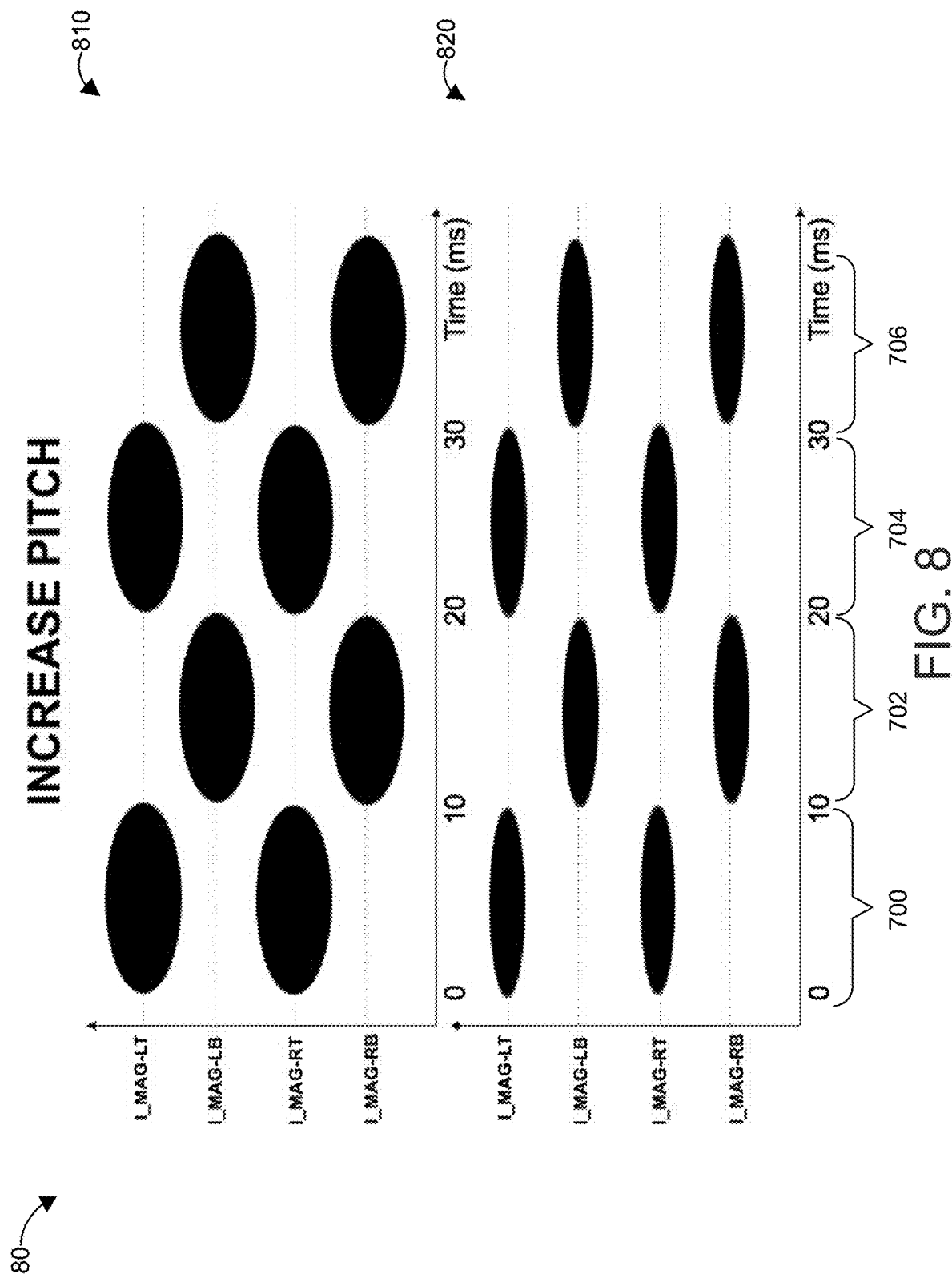

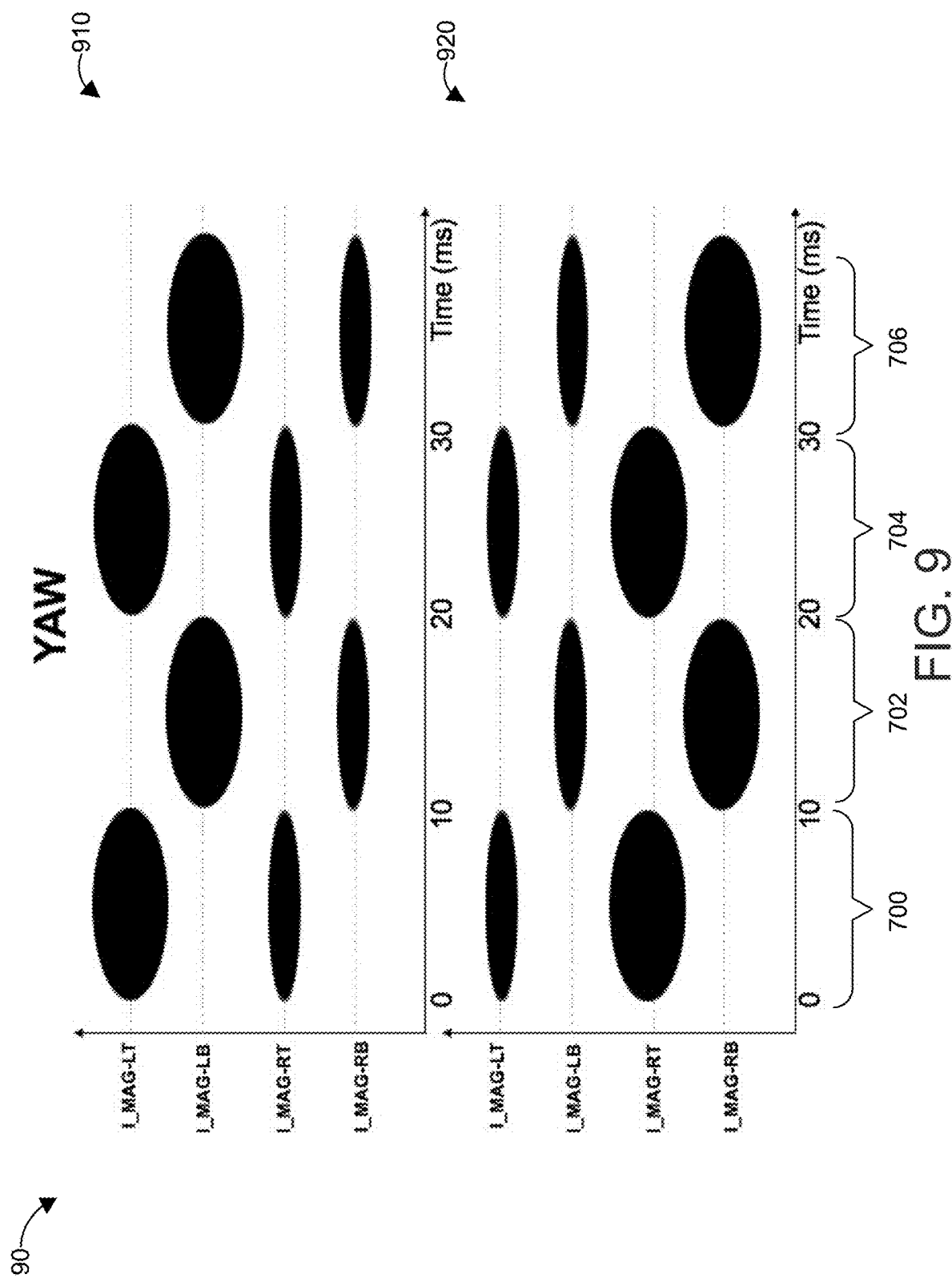

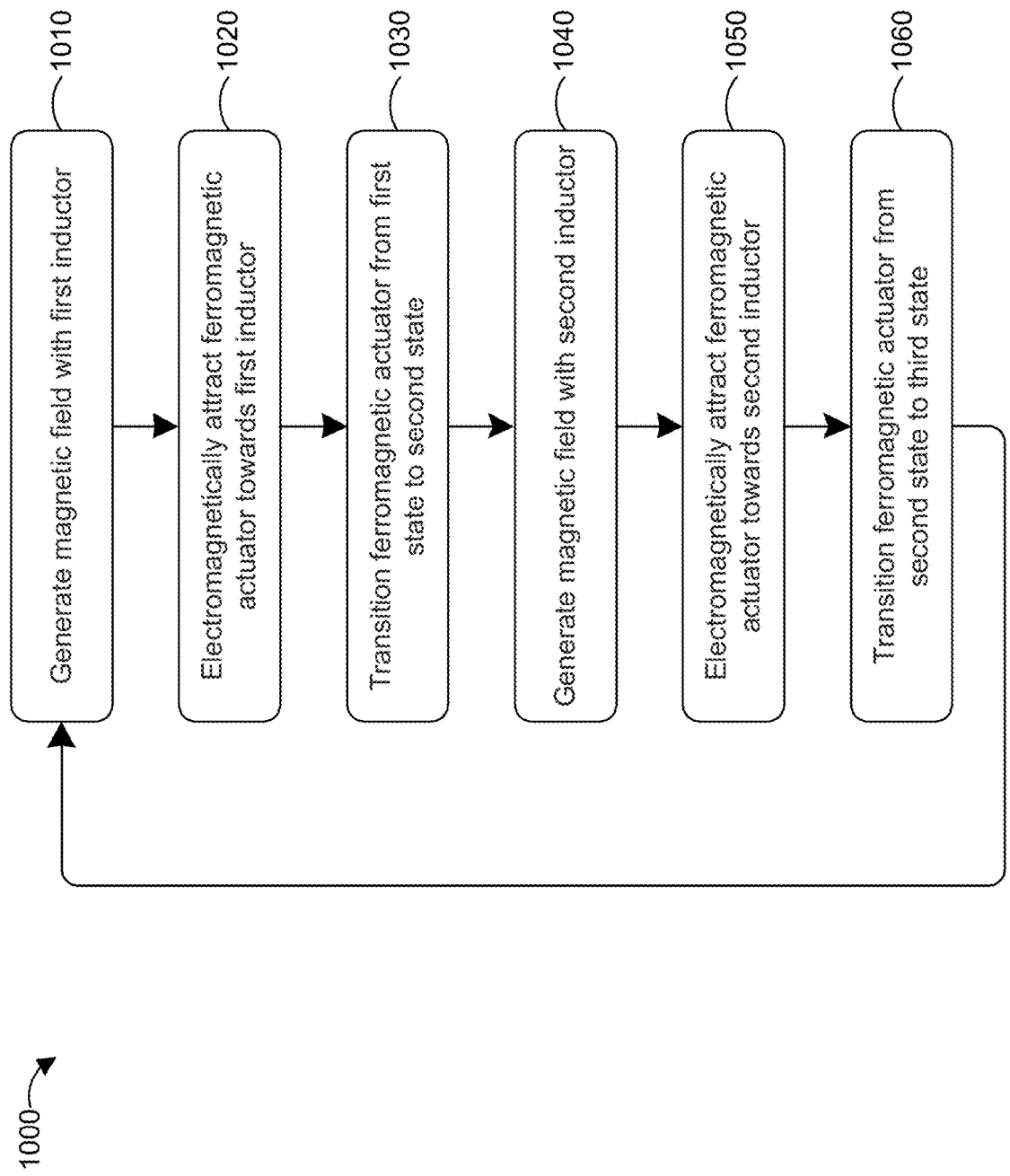

ELECTROMAGNETICALLY-DRIVEN FERROMAGNETIC ACTUATOR DEVICE

TECHNICAL FIELD

The present application relates generally to electromechanical actuators and small driven machines actuated thereby.

BACKGROUND

Micro aerial vehicles (MAVs) and similar machines may enable a large set of new capabilities for remote detection, surveillance, and sensing. The realization of such systems requires the highest level of integration between various subsystems in order to achieve optimal mass and volumetric density.

The state-of-the-art in MAV technology has achieved only limited functionality, primarily due to challenges in development of propulsion technology that achieves high work density and low cost of transport. Magnetic actuation for microelectromechanical systems (MEMs) has long been understood to offer attractive characteristics in terms of force generation, control, and low-voltage operation, but it faces significant challenges in terms of fabrication complexity and high-current operation.

Various prior ways of actuating prime movers for use in micro vehicle applications such as MAVs have had limitations with regard to device complexity, heat generation, power consumption, weight considerations and other issues.

It would be desirable to overcome one or more of these deficiencies.

SUMMARY

Example embodiments described herein have innovative features, no single one of which is indispensable or solely responsible for their desirable attributes. The following description and drawings set forth certain illustrative implementations of the disclosure in detail, which are indicative of several exemplary ways in which the various principles of the disclosure may be carried out. The illustrative examples, however, are not exhaustive of the many possible embodiments of the disclosure. Without limiting the scope of the claims, some of the advantageous features will now be summarized. Other objects, advantages and novel features of the disclosure will be set forth in the following detailed description of the disclosure when considered in conjunction with the drawings, which are intended to illustrate, not limit, the invention.

In an aspect, the invention is directed to an apparatus comprising: a semiconductor device comprising: a semiconductor substrate; a multilevel wiring network disposed on the semiconductor substrate; and an inductor comprising a ferromagnetic core, the inductor integrated on top of the multilevel wiring network; and a ferromagnetic actuator magnetically coupled to the inductor, wherein the inductor generates a magnetic field that causes the ferromagnetic actuator to transition from a first state to a second state.

In one or more embodiments, the ferromagnetic actuator is mechanically coupled to the semiconductor device. In one or more embodiments, the ferromagnetic actuator comprises a magnetic cantilever. In one or more embodiments, a first end of the ferromagnetic actuator is mechanically coupled to the semiconductor device. In one or more embodiments, a portion of the magnetic cantilever is disposed closer to the inductor in the second state than in the first state. In one or more embodiments, the magnetic cantilever is elongated along an axis, in the first state, the axis is parallel to a principal plane of the ferromagnetic core, and in the second state, the axis is angled with respect to the principal plane. In one or more embodiments, the apparatus further comprises an artificial appendage mechanically coupled to a second end of the ferromagnetic actuator. In one or more embodiments, the artificial appendage comprises a wing.

In one or more embodiments, the apparatus further comprises a capacitor electrically disposed in parallel with the inductor to form an LC circuit. In one or more embodiments, the apparatus further comprises a semiconductor switch that is electrically coupled to the LC circuit. In one or more embodiments, the semiconductor switch has a first state in which electrical current flows into the LC circuit and a second state in which no electrical current flows into the LC circuit. In one or more embodiments, when the semiconductor switch is in the first state, an alternating current flows through the LC circuit, the alternating current causing the inductor to generate the magnetic field.

Another aspect of the invention is directed to an assembly comprising: a first semiconductor device comprising: a first semiconductor substrate; a first multilevel wiring network disposed on the first semiconductor substrate; and a first inductor comprising a first ferromagnetic core, the first inductor integrated on top of the first multilevel wiring network; a second semiconductor device comprising: a second semiconductor substrate; a second multilevel wiring network disposed on the second semiconductor substrate; and a second inductor comprising a second ferromagnetic core, the second inductor integrated on top of the second multilevel wiring network, wherein the first and second inductors are disposed between the first and second semiconductor substrates. The assembly further comprises a ferromagnetic actuator magnetically coupled to the first and second inductors, wherein the first inductor generates a first magnetic field that causes the ferromagnetic actuator to transition from a first state to a second state, and the second inductor generates a second magnetic field that causes the ferromagnetic actuator to transition from the second state to a third state.

In one or more embodiments, the ferromagnetic actuator is mechanically coupled to the first and second semiconductor devices. In one or more embodiments, the ferromagnetic actuator comprises a magnetic cantilever. In one or more embodiments, a first end of the ferromagnetic actuator is mechanically coupled to the first and second semiconductor devices. In one or more embodiments, a portion of the magnetic cantilever is disposed closer to the first semiconductor device in the second state than in the first state, and the portion of the magnetic cantilever is disposed closer to the second semiconductor device in the third state than in the first state In one or more embodiments, the magnetic cantilever is elongated along an axis; in the first state, the axis is parallel to a principal plane of the first ferromagnetic core; in the second state, the axis is angled with respect to the principal plane such that the portion of the magnetic cantilever is disposed closer to the first semiconductor device than in the first state, and in the third state, the axis is angled with respect to the principal plane such that the portion of the magnetic cantilever is disposed closer to the second semiconductor device than in the first state. In one or more embodiments, the assembly further comprises an artificial appendage mechanically coupled to a second end of the ferromagnetic actuator. In one or more embodiments, the artificial appendage comprises a wing.

In one or more embodiments, the assembly further comprises a first capacitor electrically disposed in parallel with the first inductor to form a first LC circuit; and a second capacitor electrically disposed in parallel with the second inductor to form a second LC circuit. In one or more embodiments, the assembly further comprises a first semiconductor switch that is electrically coupled to the first LC circuit; and a second semiconductor switch that is electrically coupled to the second LC circuit. In one or more embodiments, each semiconductor switch has a first state in which electrical current flows into the respective LC circuit and a second state in which no electrical current flows into the respective LC circuit. In one or more embodiments, when the first semiconductor switch is in the first state, a first alternating current flows through the first LC circuit, the first alternating current causing the first inductor to generate the first magnetic field, and when the second semiconductor switch is in the first state, a second alternating current flows through the second LC circuit, the second alternating current causing the second inductor to generate the second magnetic field. In one or more embodiments, when the first semiconductor switch is in the first state, the second semiconductor switch is in the second state.

Yet another aspect of the invention is directed to a method comprising: controllably generating a first magnetic field with a first inductor disposed on top of a first multilevel wiring network, the first multilevel wiring network disposed on a first semiconductor substrate; electromagnetically attracting a ferromagnetic actuator towards the first inductor, the ferromagnetic actuator magnetically coupled to the first inductor; and transitioning the ferromagnetic actuator from a first state to a second state, wherein a portion of the ferromagnetic actuator is disposed closer to the first inductor in the second state than in the first state.

In one or more embodiments, the method further comprises flowing a first electrical current through the first inductor to generate the first magnetic field. In one or more embodiments, the method further comprises flowing the first electrical current through a first LC circuit, the first LC circuit comprising the first inductor. In one or more embodiments, the method further comprises operating a first semiconductor switch in a first state to allow the first electrical current to flow through the first LC circuit, the first semiconductor switch electrically coupled to the first LC circuit. In one or more embodiments, the method further comprises operating the first semiconductor switch in a second state to stop the first electrical current from flowing through the first LC circuit, thereby stopping the first inductor from generating the first magnetic field. In one or more embodiments, the method further comprises generating an alternating current in the first LC circuit. In one or more embodiments, the method further comprises transitioning the first semiconductor switch between the first and second states at a predetermined frequency. In one or more embodiments, the predetermined frequency corresponds to a resonance frequency of the first LC circuit.

In one or more embodiments, the method further comprises controllably generating a second magnetic field with a second inductor disposed on top of a second multilevel wiring network, the second multilevel wiring network disposed on a second semiconductor substrate, wherein the first and second inductors are disposed between the first and second semiconductor substrates; electromagnetically attracting the ferromagnetic actuator towards the second inductor, the ferromagnetic actuator magnetically coupled to the second inductor; and transitioning the ferromagnetic actuator from the first state or the second state to a third state, wherein the portion of the ferromagnetic actuator is disposed closer to the second inductor in the third state than in the first or second states. In one or more embodiments, the method further comprises flowing a second electrical current through the second inductor to generate the second magnetic field. In one or more embodiments, the method further comprises flowing the second electrical current through a second LC circuit, the second LC circuit comprising the second inductor. In one or more embodiments, the method further comprises operating a second semiconductor switch in the first state to allow the second electrical current to flow through the second LC circuit, the second semiconductor switch electrically coupled to the second LC circuit. In one or more embodiments, the method further comprises operating the second semiconductor switch in the second state to stop the second electrical current from flowing through the second LC circuit, thereby stopping the second inductor from generating the second magnetic field. In one or more embodiments, the method further comprises generating a second alternating current in the second LC circuit.

In one or more embodiments, the method further comprises comprising generating the first electrical current while the second semiconductor switch is in the second state and generating the second electrical current while the first semiconductor switch is in the second state. In one or more embodiments, the method further comprises repeatedly transitioning the ferromagnetic actuator between the second and third states.

BRIEF DESCRIPTION OF THE DRAWINGS

For a fuller understanding of the nature and advantages of the present concepts, reference is made to the following detailed description of preferred embodiments and in connection with the accompanying drawings, in which:

FIG. 8 is a schematic illustration of the current flowing through the inductors in the LC circuits of front and rear apparatuses in the assembly illustrated in FIG. 4 to increase pitch during flight.

FIG. 9 is a schematic illustration of the current flowing through the inductors in the LC circuits of front and rear apparatuses in the assembly illustrated in FIG. 4 to change yaw during flight; and FIG. 10 is a flow chart of a method for operating an electromagnetic actuator apparatus according to one or more embodiments.

DETAILED DESCRIPTION

Figure 1:
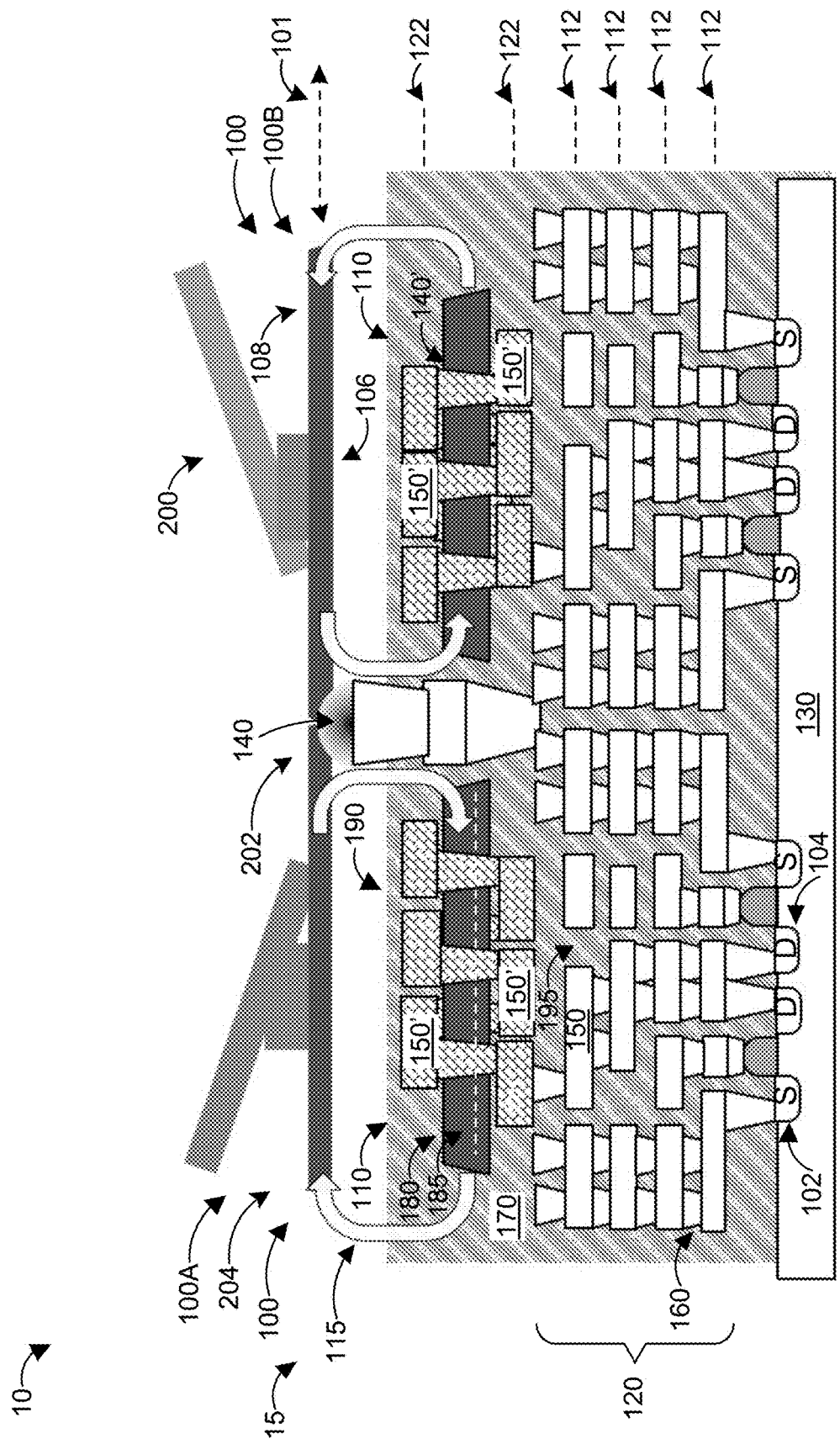
FIG. 1 is a representative cross section of an electromagnetic actuator assembly in a first state according to one or more embodiments.

Many applications exist for very small machines such as micro electromechanical vehicles, including micro aerial vehicles or MAVs. Engineering limitations (weight, cost, power consumption, manufacturing) make it difficult or impossible to arbitrarily reduce the size of such machines, as the component parts become inoperable or impossible to properly make and apply to the overall machine. This disclosure addresses a new way of moving or propelling small electromechanical devices, machines and vehicles. While MAV applications are discussed in more detail herein, it should be appreciated that the present actuation devices and methods and techniques of making the same apply to many other examples in industry, consumer products, military applications, security, wildlife management, entertainment, atmospheric studies, medicine, or a host of other fields in which small machines using electro-mechanically driven actuators are needed.

In one or more instances, an electromagnetic actuator apparatus includes a first semiconductor device and a ferromagnetic actuator disposed on the semiconductor device. The first semiconductor device includes a semiconductor substrate, a multi-level wiring structure disposed on the semiconductor substrate, and an inductor disposed on top of the multi-level wiring structure. The inductor can include a ferromagnetic core. The ferromagnetic actuator is magnetically coupled to the inductor.

When current flows through the inductor, the inductor generates a magnetic field that attracts the ferromagnetic actuator towards the inductor. This electromagnetic attraction causes the ferromagnetic actuator to transition from a first state to a second state. In the second state, a portion of the ferromagnetic actuator is disposed closer to the inductor than it is in the first state.

The inductor can be disposed in parallel with a capacitor to form an LC circuit. A semiconductor switch can be electrically coupled to the LC circuit to allow or prevent current from flowing therethrough depending on the state of the semiconductor switch. When the semiconductor switch is in the first state, current flows through the LC circuit and the inductor generates the magnetic field. When the semiconductor switch is in the second state, no current flows through the LC circuit the inductor does not generate the magnetic field. The semiconductor switch can be rapidly switched between the first and second states at a predetermined frequency to generate an alternating current (AC) in the LC circuit having the predetermined frequency. The predetermined frequency can correspond to the resonance frequency of the LC circuit.

A second semiconductor device can be disposed on the opposing side of the ferromagnetic actuator. The second semiconductor device can be the same as the first semiconductor device. The inductor in the second semiconductor device can generate a magnetic field that attracts the ferromagnetic actuator towards the inductor in the second semiconductor. When the inductor in the first semiconductor device generates a magnetic field, the inductor in the second semiconductor device does not generate a magnetic field so that the ferromagnetic actuator is only attracted to the magnetic field generated by the inductor in the first semiconductor device. Likewise, when the inductor in the second semiconductor device generates a magnetic field, the inductor in the first semiconductor device does not generate a magnetic field so that the ferromagnetic actuator is only attracted to the magnetic field generated by the inductor in the second semiconductor device. This allows the ferromagnetic actuator at to alternately be attracted and moved towards the inductors in the first and second semiconductor devices, which can produce a back-and-forth or up-and-down motion.

In some embodiments, a structure and/or an artificial appendage is mechanically coupled to the ferromagnetic actuator to move therewith. For example, a wing, a leg, or other structure can be mechanically coupled to the ferromagnetic actuator.

FIG. 1 is a representative cross section of an electromagnetic actuator assembly in a first state according to one or more embodiments. The electromagnetic actuator assembly 10 includes magnetic cantilevers 100 and a semiconductor chip or chiplet (in general, semiconductor chip) 15. The semiconductor chip 15 includes magnetic core inductors 110, a multi-level wiring network 120, and a semiconductor substrate 130.

The multilevel wiring network 120 provides electrical connections between PMOS and NMOS transistor gates 102, 104, the magnetic core inductor 110, and support structure 140. The multilevel wiring network 120 is arranged into wiring planes 112. FIG. 1 depicts four wiring planes 112 but without limitation on any actual number of wiring planes. Each wiring plane 112 contains wire segments 150. Electrical connections between wiring segments 150 of differing wiring planes 112 are provided by conductive vertical interconnect accesses (VIAs) 160. The spaces in the multilevel wiring network 700 are filled with a dielectric insulating material 170 such as $SiO_2$.

The support structure 140 can be a C4 contact, a solder bump, a copper pillar, or other structure. The support structure 104 mechanically supports the magnetic cantilevers 100. but any other contacts for the chip's external communication are acceptable without limitation. In some embodiments, the support structure 140 can also provide an electrical connection between the semiconductor chip 15 (e.g., the multi-level wiring network 120) and the magnetic cantilevers 100. For example, the support structure 140 can be used to apply an electrical potential (e.g., a voltage) between the magnetic cantilever(s) 100 and the underlying inductor 110 to create an electrostatic force therebetween, and/or between structure 200 and the underlying inductor 110 to create an electrostatic force therebetween. One or both electrostatic forces can be used to control the movement of the electromagnetic actuator assembly 10 (e.g., to control movement of the magnetic cantilever(s) 100 and/or movement of the structure(s) 200). For example, the electrostatic force(s) can be used to control the flight pattern when the structures 200 include wings.

The magnetic core inductors 110 are integrated on top of the multilevel wiring network 120. Each inductor 110 includes a planar magnetic core 180 and a conductive winding 190. The planar magnetic core 180 has a principal plane 185 that is substantially parallel (e.g., within +/−5 degrees) with the wiring planes 112. The conductive winding 190 of the magnetic core inductor 110 forms a general spiral on the outside of the planar magnetic core 180 and is piecewise constructed of wire segments 150' and of VIAs 140' that are disposed in at least two integration planes 122, which are formed on top of the multilevel wiring network 120 (e.g., the multilevel wiring network 120 is disposed between the substrate 130 and the integration planes 122). The VIAs 140' that form parts of the windings 190 are orthogonal (e.g., vertical) to the principal plane 185 and electrically interconnect the wire segments 150' in at least two integration planes 122.

The magnetic core 185 can include a ferromagnetic material such as Co, Ni, and/or Fe, including an alloy, compound, and/or composite thereof. Examples of such alloys include $Ni_xFe_y$, and $Co_xNi_yFe_z$. In addition, or in the alternative, magnetic core 185 can include a plurality of layers. The layers can include alternating layers of ferromagnetic layers (e.g., Co, Ni, and/or Fe, an alloy of Co, Ni, and/or Fe, etc.) and non-ferromagnetic layers. For example, the non-ferromagnetic layers can be or can include an insulating material, such as the oxides of the ferromagnetic material (e.g., $Co_xO_y$, $Ni_xO_y$, and/or $Fe_xO_y$).

In some embodiments, an interface layer can be deposited on the insulating material layer. The interface layer can be used in the fabrication process to help deposit the next ferromagnetic layer onto the insulating material layer. The material comprising interface layer can be selected to improve adhesion and/or reduce roughness at the interface between the ferromagnetic layer and the insulating material layer. Reducing the roughness at the interface of the ferromagnetic layer and the insulating material layer can reduce coercivity for the magnetic core 180. Improving the adhesion between the ferromagnetic layer and the insulating material layer can reduce the potential for film delamination. Additionally, the interface layer can serve as a diffusion barrier or getter between the ferromagnetic layer and the insulating material layer to prevent the diffusion of material constituents from the insulating material layer to the ferromagnetic layer. Further, the interface layer can be chosen to reduce or compensate mechanical film stress in the magnetic core 185. The interface layer can be comprised of Ta, Ti, W, Cr, or Pt, or a combination of any of the foregoing, depending on the particular choice of ferromagnetic material and insulating material layer.

In some embodiments, the non-ferromagnetic layers can be or can include a current-rectifying layer. For example, the current-rectifying layers can be based on Schottky diodes. Onto the ferromagnetic layer one may electrodeposit the following sequence: a semiconducting layer—p-type with work function less than ferromagnetic layer or n-type with work function greater than ferromagnetic layer; followed by an interface metal layer—with a work function less than that of p-type semiconducting material, or greater than that of n-type semiconducting material. Then, continue with the next ferromagnetic layer, and so on. Alternatively, for rectification one may use a semiconductor p-n junction in the non-ferromagnetic layer. Any semiconductor may be suitable, one would have to choose one based on several criteria, for example without limiting, the ease of contact to the magnetic material of the p and n portions, how narrow can one make the junction, and others In some embodiments, the magnetic core inductor 180 is the same as, substantially the same as, or different than one or more of the inductors described in U.S. patent application Ser. No. 15/391,278, U.S. Patent Application Publication No. 2014/0071636, and/or U.S. Pat. No. 9,647,053, which are hereby incorporated by reference. In some embodiments, the electromagnetic actuator 10 includes only one inductor 110 or more than two inductors 110. Additional inductors 110 can be integrated on the same integration planes 122 or in different integration planes.

Each inductor 180 is electrically disposed in parallel with a capacitor, such as capacitor 195, to form an LC circuit. Current can flow through the multilevel wiring structure 120 and the LC circuit based on the state of the transistor gates 102, 104. For example, current flows through the multilevel wiring structure 120 and the LC circuit when the transistor gates 102, 104 are in a first state (e.g., a first voltage is applied across the transistor gates 102, 104). However, no current flows through the multilevel wiring structure 120 or the LC circuit when the transistor gates 102, 104 are in a second state (e.g., a second voltage is applied across the transistor gates 102, 104).

The magnetic cantilever 100 includes a ferromagnetic material, such as iron (Fe), cobalt (Co), nickel (Ni), and/or another ferromagnetic material. A first end 202 of the magnetic cantilever 100 is mechanically coupled to the IC chip contact structure 140. The first end 202 can be fixedly attached or rotatably attached to the IC chip contact structure 140. A second end 204 of the magnetic cantilever 100 is not mechanically coupled or attached to the IC chip contact structure 140, allowing the second end 204 to deform (e.g., bend) or rotate with respect to the first end 202. In some embodiments, the magnetic cantilever 100 can be a ferromagnetic actuator having another structure.

Figure 2:
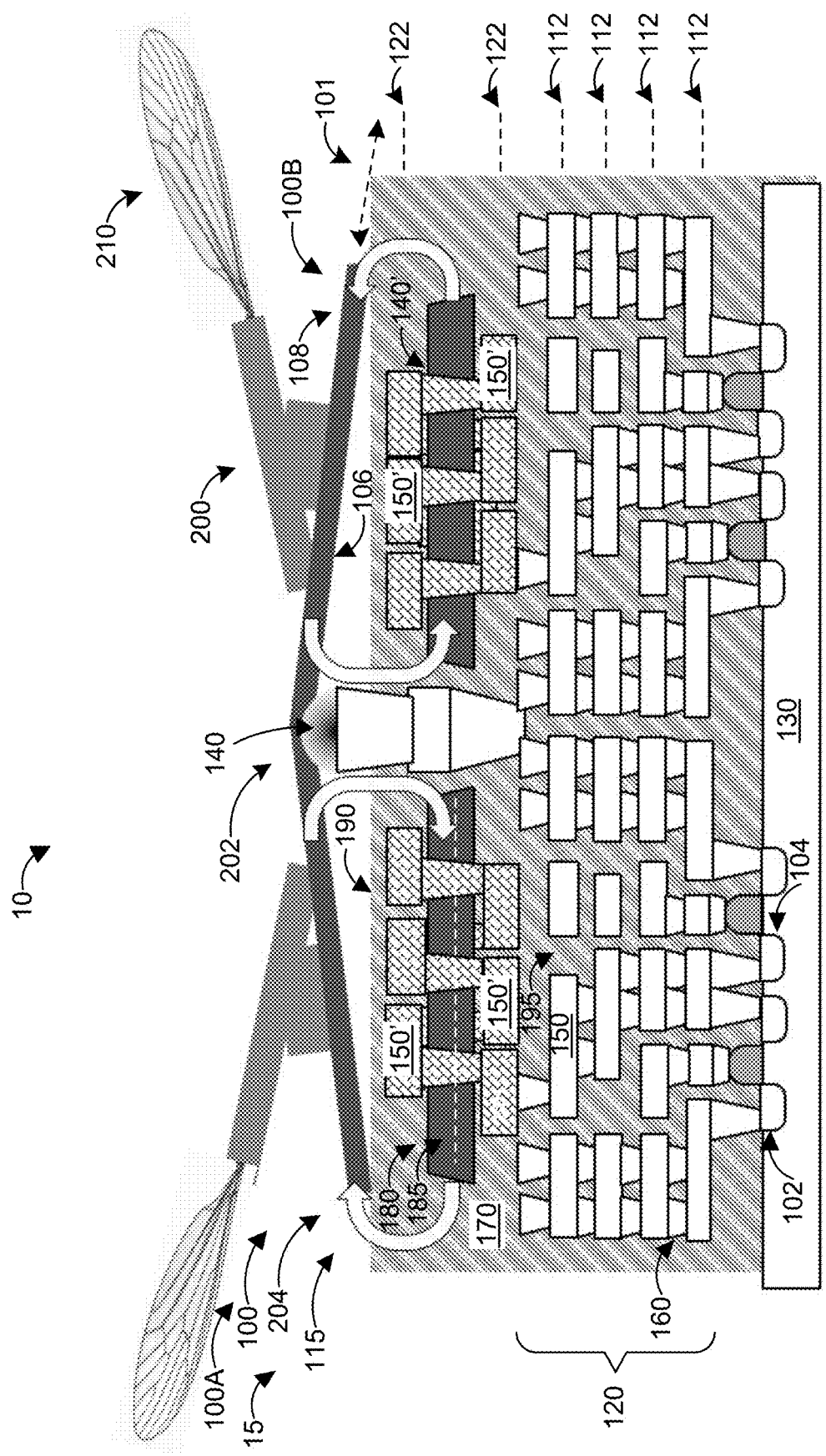
FIG. 2 is a representative cross section of an electromagnetic actuator assembly in a second state according to one or more embodiments.

When current flows through the LC circuit including inductor 110, the inductor 110 generates magnetic fields that pass through magnetic core 180 and the magnetic cantilever 100 in a magnetic field loop, as indicated by magnetic flux lines 115. The magnetic core 180 operates as an electromagnet to magnetically attract the ferromagnetic material in the magnetic cantilever 100, which causes the magnetic cantilever 100 to transition from a first state (as illustrated in FIG. 1) to a second state (e.g., as illustrated in FIG. 2). In the first state, the bottom surface 106 of the magnetic cantilever 100 is parallel (or substantially parallel) to the principal plane 185 of the magnetic core 180 and/or a wiring plane 112 or an integration plane 122. For example, the magnetic cantilever 100 is elongated along axis 101, and axis 101 is parallel or substantially parallel) to the principal plane 185 when the magnetic cantilever 100 is in the first state.

In the second state, the magnetic cantilever 100 bends or rotates downward towards the magnetic core 180 as an electromagnetic actuator. For example, at least a portion of the magnetic cantilever 100 is disposed closer to the inductor 110 when the magnetic fields are generated by the inductor 110 (e.g., when current flows through the LC circuit) than when no magnetic fields are generated by the inductor 110. For example, the axis 101 can be angled with respect to the principal plane 185 of the magnetic core 180 and/or a wiring plane 112 or an integration plane 122 when the magnetic cantilever 100 is in the second state. The magnetic cantilever 100 can be semi-rigid and/or can include a shape-memory material (e.g., a shape-memory alloy) such that the magnetic cantilever 100 returns to the first state after the inductor 110 stops generating the magnetic fields.

A structure 200 is optionally disposed on (e.g., mechanically coupled to) a top surface 108 of the magnetic cantilever 100. The structure 200 can include an artificial appendage such as a wing, a leg, an arm, or other appendage. Alternatively, the structure 200 can include a support structure that is mechanically coupled to the artificial appendage. The support structure can be rigid or semi-rigid in some embodiments, for example to translate force from the magnetic cantilever 100 to the artificial appendage. In the embodiment illustrated in FIG. 1, the structure 200 is a support structure for an artificial wing.

Each magnetic cantilever 100 can operate independently. For example, the electromagnetic actuator assembly 10 can operate so that magnetic cantilever 100A is activated (e.g., in the second state) while magnetic cantilever 100B is not activated (e.g., in the first state). In some embodiments, the magnetic cantilevers 100A, 100B can repeatedly transition back and forth between the first and second states at predetermined intervals, for example at a predetermined frequency or periodicity (periodic motion). But this regularity is not limiting of the present concept. When the magnetic cantilevers 100A, 100B (in general, magnetic cantilevers 100) are both in operation during the same time interval, they can transition between the first and second states at the same time (in phase) or at different times (out of phase).

The rate or frequency of movement (e.g., between first and second states) of each magnetic cantilever 100 corresponds to the on/off frequency of the output current flowing through the respective LC circuits. Each output current is preferably an AC current having a frequency that preferably corresponds to the resonance frequency of the respective LC circuit. The resonance frequency of the LC circuit can be about 1 MHz in some embodiments. Each output current is turned on and off at the desired operating frequency for activating the respective magnetic cantilever 100. The output current through the LC circuits can be turned on and off at a frequency of about 1 kHZ or less, such as about 50 Hz to about 1 kHz, including about 100 Hz, about 200 Hz, about 300 Hz, about 400 Hz, about 500 Hz, about 600 Hz, about 700 Hz, about 800 Hz, about 900 Hz, or any frequency or frequency range between any two of the foregoing frequencies.

The movement or actuation of the structures 200 (e.g., including the robotic appendage) can cause the electromagnetic actuator assembly 10, or a larger apparatus that includes assembly 10, to perform an action, which can depend on the type of structure 200 attached thereto. For example, when the structures 200 include wings (e.g., wings 210 as illustrated in FIG. 2), the action can include flying and various actions relating to flying, such as increasing or decreasing the pitch, rolling, yawing, accelerating, or decelerating. In another example, when the structures 200 include legs, the action can include walking, running, jumping, or other motion.

In some embodiments, a device can include two or more electromagnetic actuator assemblies that can attract a magnetic cantilever in different directions. For example, when the structures 200 include wings, two electromagnetic actuator assemblies (e.g., two or more electromagnetic actuator assemblies 10) can be disposed on opposing sides of each magnetic cantilever 100 to alternately attract the magnetic cantilever 100 (and hence the wings) in opposing first and second directions. The first and second directions and correspond to "up" and "down" when the device is oriented orthogonally to the direction of gravitational pull.

Figure 3:
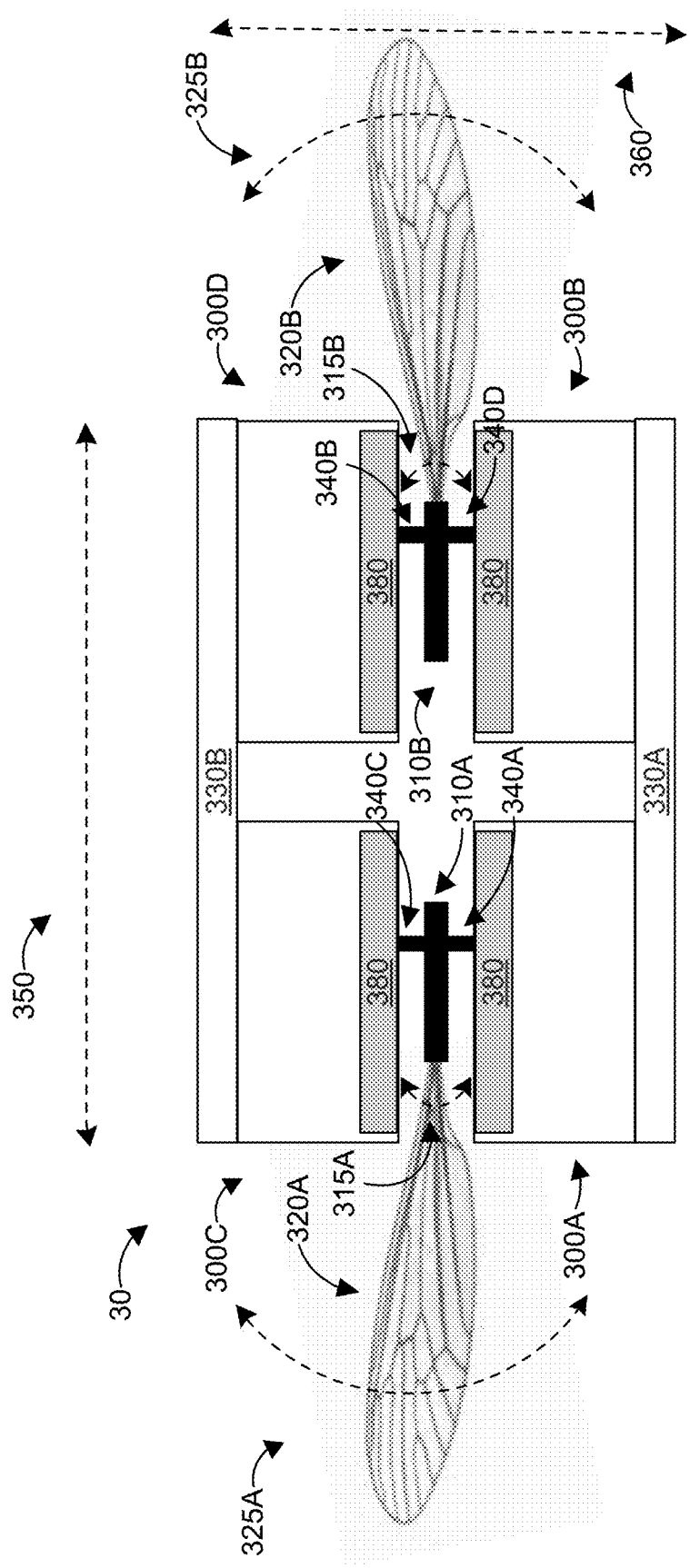
FIG. 3 is a block diagram of an apparatus for electromechanically actuating two wings in opposing directions according to one or more embodiments.

FIG. 3 is a block diagram of an apparatus 30 for electromechanically actuating two wings 320 in opposing directions according to one or more embodiments. The apparatus 30 includes lower electromagnetic actuator assemblies 300A, 300B, upper electromagnetic actuator assemblies 300C, 300D, magnetic cantilevers 310A, 310B, wings 320A, 320B, and substrates 330A, 300B. Magnetic cantilever 310A is disposed between lower and upper electromagnetic actuator assemblies 300A, 300C. A portion of the magnetic cantilever 310A is mechanically coupled to structures 340A, 340C, which extend from lower and upper electromagnetic actuator assemblies 300A, 300C, respectively. Each structure 340A, 340C can be the same as or different than IC chip contact structure 140, discussed above. The lower and upper electromagnetic actuator assemblies 300A, 300C include a respective inductor 380 integrated above a respective multilevel wiring structure. The lower and upper electromagnetic actuator assemblies 300A, 300C can be the same as or different than electromagnetic actuator assembly 10. The magnetic cantilever 310A is magnetically coupled to the inductors 380 in lower and upper electromagnetic actuator assemblies 300A, 300C. When current flows through the lower electromagnetic actuator assembly 300A, the inductor 380 in lower electromagnetic actuator assembly 300A generates magnetic fields that attract the magnetic cantilever 310A downward, as indicated by arrows 315A. The downward movement of the magnetic cantilever 310A causes the wing 320A to rotate downwards, as indicated by arrows 325A. In contrast, the magnetic cantilever 300A is attracted upwards (as indicated by arrows 315A) by magnetic fields generated by the inductor 380 in upper electromagnetic actuator assembly 300C when current flows therethrough. The upward movement of the magnetic cantilever 310A causes the wing 320A to rotate upwards, as indicated by arrows 325A.

As can be seen, the lower and upper electromagnetic actuator assemblies 300A, 300C can be controlled to "flap" the wing 320A in an upwards and downward motion. The frequency of the upwards and downward motion can be controlled such that it corresponds to the resonance frequency of the wing 320A and/or the magnetic cantilever 310A.

Magnetic cantilever 310B is disposed between lower and upper electromagnetic actuator assemblies 300B, 300D. A portion of the magnetic cantilever 310B is mechanically coupled to structures 340B, 340D, which extend from lower and upper electromagnetic actuator assemblies 300B, 300D, respectively. Each structure 340B, 340D can be the same as or different than IC chip contact structure 140, discussed above. The lower and upper electromagnetic actuator assemblies 300B, 300D include a respective inductor 380 integrated above a respective multilevel wiring structure. The lower and upper electromagnetic actuator assemblies 300B, 300D can be the same as or different than electromagnetic actuator assembly 10. The magnetic cantilever 310B is magnetically coupled to the inductors 380 in lower and upper electromagnetic actuator assemblies 300B, 300D. When current flows through the lower electromagnetic actuator assembly 300B, the inductor 380 in lower electromagnetic actuator assembly 300B generates magnetic fields that attract the magnetic cantilever 310B downward, as indicated by arrows 315B. The downward movement of the magnetic cantilever 310B causes the wing 320B to rotate downwards, as indicated by arrows 325B. In contrast, the magnetic cantilever 300B is attracted upwards (as indicated by arrows 315B) by magnetic fields generated by the inductor 380 in upper electromagnetic actuator assembly 300D when current flows therethrough. The upward movement of the magnetic cantilever 310B causes the wing 320B to rotate upwards, as indicated by arrows 325B.

The lower electromagnetic actuator assemblies 300A, 300B can be fabricated on a common substrate 330A, which can decrease costs and simply manufacturing. In addition, or in the alternative, the upper electromagnetic actuator assemblies 300C, 300D can be fabricated on a common substrate 330B, which can provide the same advantages discussed above. In some embodiments, the apparatus can have a width 350 of about 2 mm and a height 360 of about 2 mm. As used herein, "about" means plus or minus 10% of the relevant value.

As can be seen, the lower and upper electromagnetic actuator assemblies 300B, 300D can be controlled to "flap" the wing 320B in an upwards and downward motion. The frequency of the upwards and downward motion can be controlled such that it corresponds to the resonance frequency of the wing 320B and/or the magnetic cantilever 310B.

The on/off frequency of the AC current, that passes through each inductor 380, and/or the amplitude of the AC current can be controlled to produce a desired action in the individual wing 320A-D and in the overall motion of the apparatus 30. For example, the on/off frequency and/or the amplitude of the AC current can be controlled such that the apparatus 30 takes off, lands, steers around an obstacle, pitches, rolls, yaws, accelerates, decelerates, and/or performs another action. Of course, if the wings 325A and 325B are replaced with legs, the frequency and/or the amplitude of the AC current can be controlled such that the apparatus 30 walks, runs, climbs stairs, and/or performs another action. In some embodiments, the AC current frequency can also be controlled to control the desired action.

In some embodiments, the magnetic cantilevers 310A, 310B and wings 320A, 320B are the same as or different than magnetic cantilevers 100 and wings 210.

Figure 4:
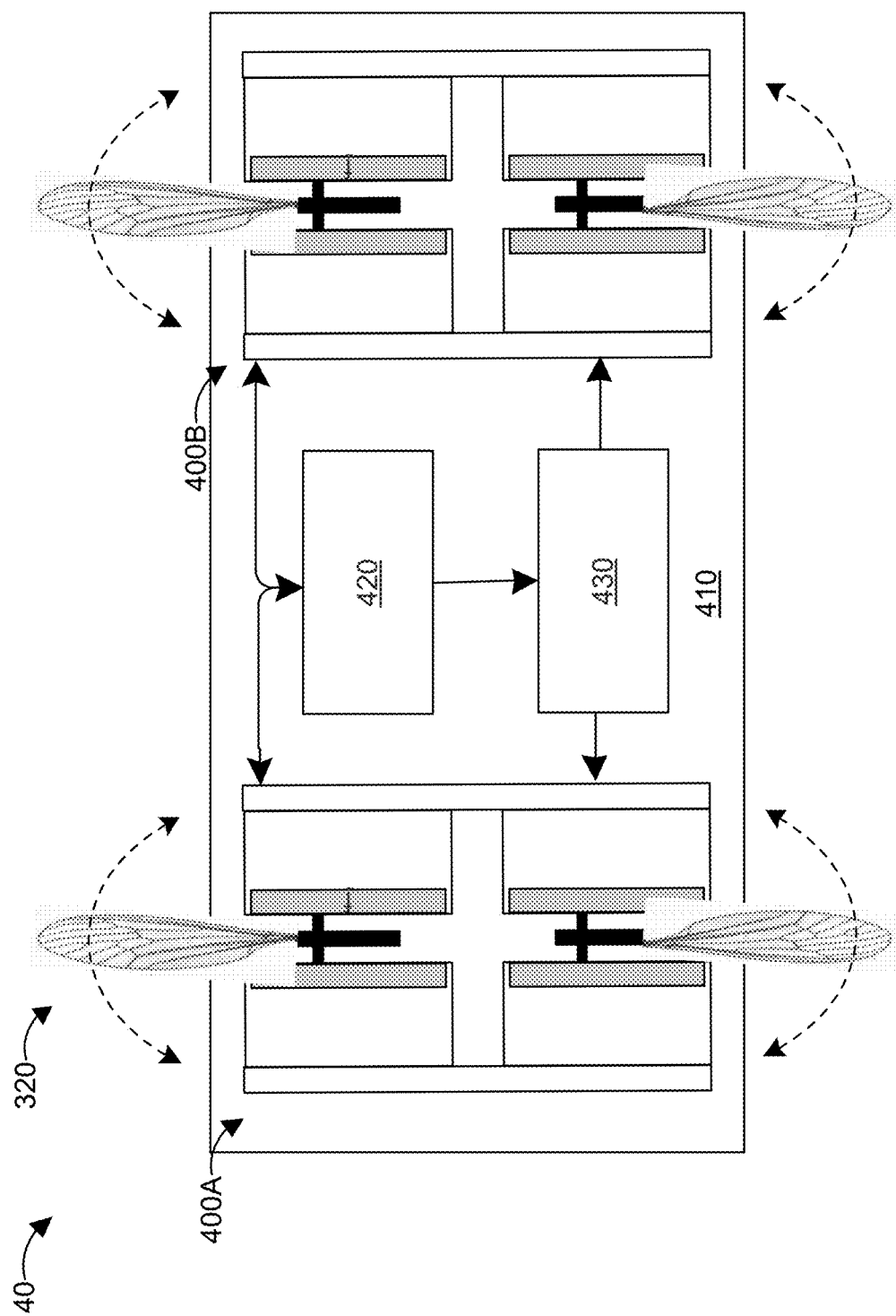
FIG. 4 is a block diagram of an assembly that includes two apparatuses for electromechanically actuating four wings.

FIG. 4 is a block diagram of an assembly 40 that includes two apparatuses 400A, 400B for electromechanically actuating wings 320. Each apparatus 400A, 400B can be the same as or different than apparatus 30 discussed above. In one example, apparatus 400A is disposed at the front of the assembly 40 and apparatus 400B is disposed at the rear of the assembly 40. The apparatuses 400A, 400B can receive control commands or messages from a microcontroller 420 that is in electrical communication therewith. For example, each wing 320 can be individually controlled to provide a desired action or motion of the assembly, for example as discussed above. In one example, the wings 320 coupled to apparatus 400A can move in phase or out of phase with each other. Likewise, the wings 320 coupled to apparatus 400B can move in phase or out of phase with each other. In addition, one or both wing(s) 320 coupled to apparatus 400A can move in phase or out of phase with one or both wing(s) 320 coupled to apparatus 400B. The apparatuses 400A, 400B can convert the commands from the microcontroller to duration and synchronization of voltage pulses on $V_g$ for activating the electromagnetic actuator assemblies 300A-D.

The apparatuses 400A, 400B are mounted on a package substrate 410, which can be a ceramic package substrate. In some embodiments, the package substrate 410 can serve as the substrate for a thin-film solid state lithium battery, which can be used to power the assembly 40. Power including the gate $V_g$ and/or drive voltages V_drive (discussed below) can be provided by a power management unit 430 that is electrical communication with the apparatuses 400A, 400B and with the optional battery in package substrate 410. The microcontroller 420 can be in electrical communication with the power management unit 430 to provide commands thereto, such as to set the drive voltage V_drive for each apparatus 400A, 400B.

Figure 5:
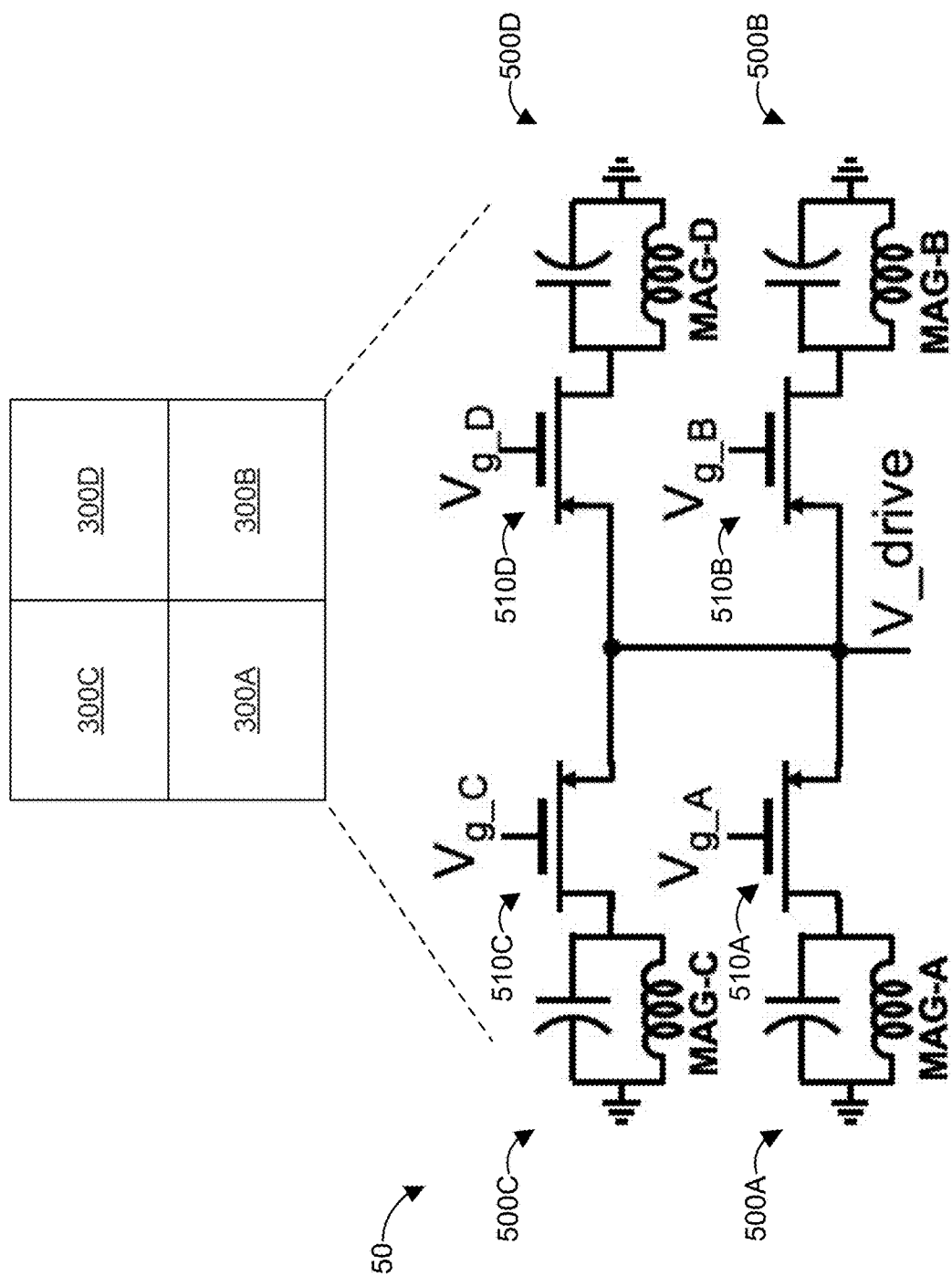
FIG. 5 is a schematic of the LC circuits formed in the electromagnetic actuator assemblies illustrated in FIG. 3.

FIG. 5 is a schematic 50 of the LC circuits 500A-D formed in the electromagnetic actuator assemblies 300A-D illustrated in FIG. 3. Each LC circuit 500A-D (in general, LC circuit 500) in electrically coupled to a semiconductor switch 510A-D (in general, switch 510). Each switch 510 can be a transistor, such as field-effect transistor (FET). In a specific example, the switch is a metal-oxide-semiconductor FET (MOSFET) such as a p-type MOSFET (pMOSFET) an n-type MOSFET (nMOSFET). Each switch 510 has a first state in which current flows through the LC circuit 500 and a second state in which current does not flow through the LC circuit 500. Each switch 510 can transition between the first and second states at a frequency to generate AC current in the respective LC circuit 500. The frequency of the AC current can be the same as, about the same as, or different than the resonance frequency of the LC circuit 500, which can be about 1 MHz in some embodiments.

A first terminal or gate of each switch 510 is electrically coupled to a respective gate voltage $V_{g\_A}$-$V_{g\_D}$ (in general, $V_g$). A second terminal or gate of each switch 510 is electrically coupled to a drive voltage V_drive. Each switch 510 can transition between the first and second states based on the difference between the respective gate voltage $V_g$ and the drive voltage V_drive and the threshold voltage of the respective switch 510. Each $V_g$ is preferably varied while V_drive is held constant in order to individually control each switch 510. For example, each switch 510 (e.g., when the switch 510 is a pMOSFET) can be in the first state when $V_g$ equals V_drive and in the second state when $V_g$ is less than V_drive (e.g., when $V_g$ is lowered below V_drive minus the threshold voltage). In some embodiments, the threshold voltage can be about 0.5 V, about 0.6 V, or about 0.7 V, or any voltage between any two of the foregoing voltages. Alternatively, each switch 510 (e.g., when each switch 510 is an nMOSFET) can be in the first state when $V_g$ is below V_drive minus the threshold voltage and in the second state when $V_g$ equals V_drive. In another embodiment, V_drive is varied while $V_g$ is held constant in order to control the switches 510 together. V_drive can be provided as an input to each apparatus (e.g., apparatus 30) from a power management unit.

Figure 6:
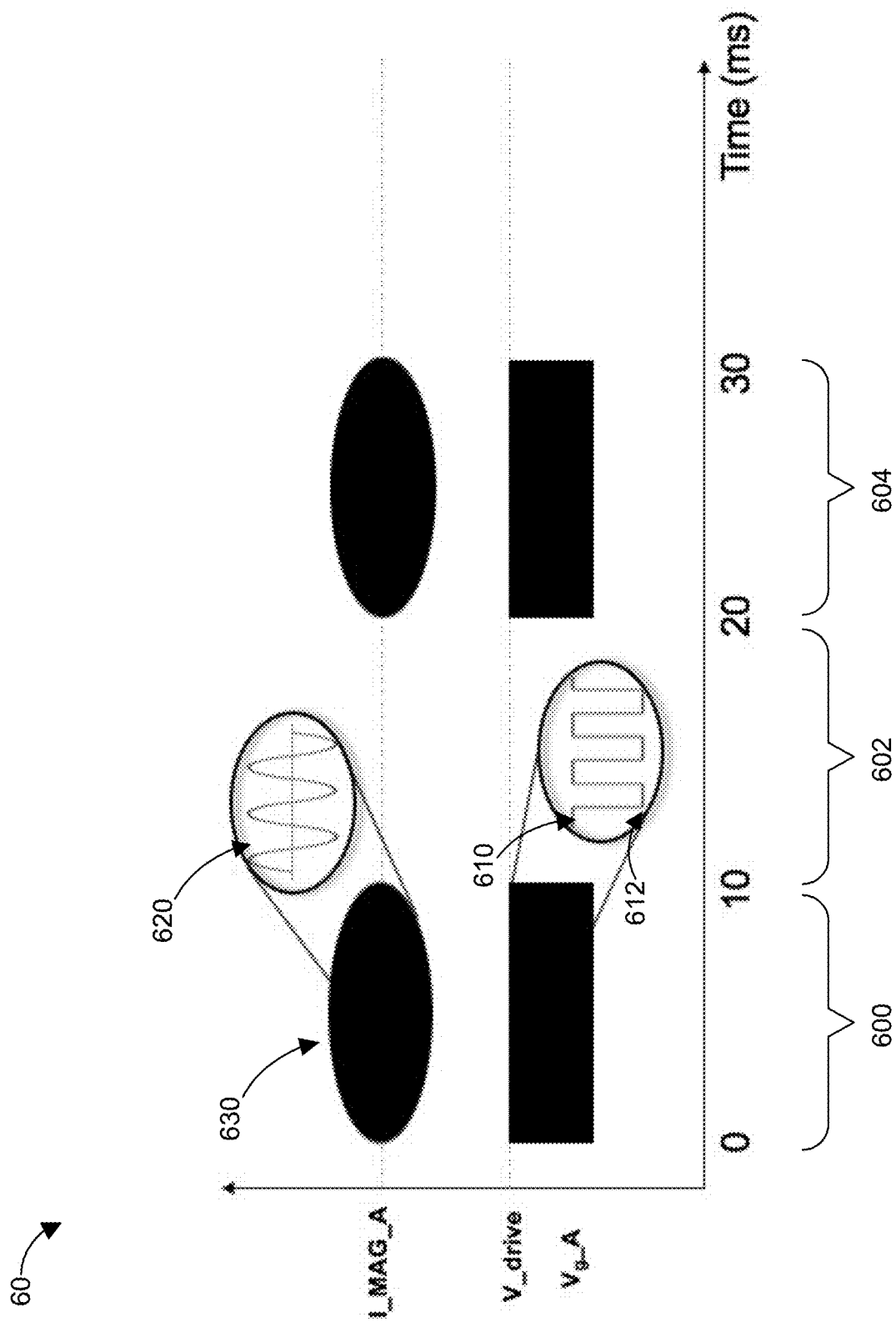
FIG. 6 is a schematic illustration of the gate voltage at a representative switch over time and the resulting current flowing through the inductor in the corresponding LC circuit.

FIG. 6 is a schematic illustration 60 of $V_{g\_A}$ at representative switch 510A over time and the resulting current I_MAG_A flowing through the inductor in the corresponding LC circuit 500A. The gate voltage $V_g$ for the other switches 510B-D can be controlled in the same way or in a different way than gate voltage $V_{g\_A}$.

During a first time period 600, $V_{g\_A}$ varies between a high voltage 610 (e.g., approximately equal to the drive voltage V_drive) and a low voltage 612 (e.g., approximately equal to zero, the reference potential) at a frequency, appearing as a square wave. The oscillation of $V_{g\_A}$ causes the switch 510A to transition between the first and second states, which causes AC current 620 in the LC circuit 500A due to the alternate charging and discharging of the inductor and capacitor in LC circuit 500A. As discussed above, the AC current 620 causes the inductor in LC circuit 500A to generate an alternating magnetic field. The AC current 620 can have a frequency that is equal to approximately equal to the resonance frequency of the LC circuit 500A.

When AC current 620 is turned on during time period 600, the inductor's magnetic core functions as an electromagnet to magnetically attract the ferromagnetic material in the magnetic cantilever (e.g., magnetic cantilever 100) to cause a wing (or other structure) to flap upwards or downwards. For example, AC current 620 is turned on, for a duration of 10 ms, every 20 ms such that the frequency that the AC current 620 is turned on is 50 Hz in FIG. 6, causing the wing to flap upwards or downwards at 50 Hz. The wing would flap in the opposite direction when AC current in LC circuit 500A is turned off (and AC current in the opposing LC circuit 500C is turned on) during time period 602 at the same frequency (50 Hz). Thus, the wing would flap upwards and downwards at 50 Hz.

Over the first time period 600, I_MAG_A optionally increases over a first portion and then optionally decreases over a second portion, as indicated by oval 630, to taper (e.g., gradually transition) the electromagnetic force on and off, respectively. In another embodiment, I_MAG_A can have a constant intensity (e.g., a step transition) when it is turned on and/or off, which would be indicated by a rectangle instead of oval 630. Other variations in the amplitude of I_MAG_A over time (and thus variations in the amplitude of the corresponding attractive magnetic field) are possible and can be dependent on the type of wing (or other structure coupled to the cantilever), its mass, and/or desired motor movement. The magnitude of I_MAG_A over time (and thus the magnitude of the corresponding attractive magnetic field) can be controlled by adjusting the gate voltage $V_g$ pulse width.

The schematic illustration 60 also illustrates a second time period 610 when $V_{g\_A}$ is 0. Over the second time period 602, the switch 510A remains in the second state and no current flows through LC circuit 510A. This corresponds to a time period when the electromagnet is turned off and the magnetic cantilever is not magnetically attracted towards the inductor (e.g., magnetic core) of LC circuit 510A, for example during a coordinated action of assembly 40. For example, during time period 602, the magnetic cantilever can be magnetically attracted in the opposite direction by the inductor (e.g., magnetic core) of LC circuit 510C by flowing AC current through LC circuit 510C.

In time period 604, the electromagnet is alternately turned on and off in the same way as in time period 600. In some embodiments, the magnitude of the I_MAG_A current can be increased or decreased within a time period and/or between time periods.

Figure 7:
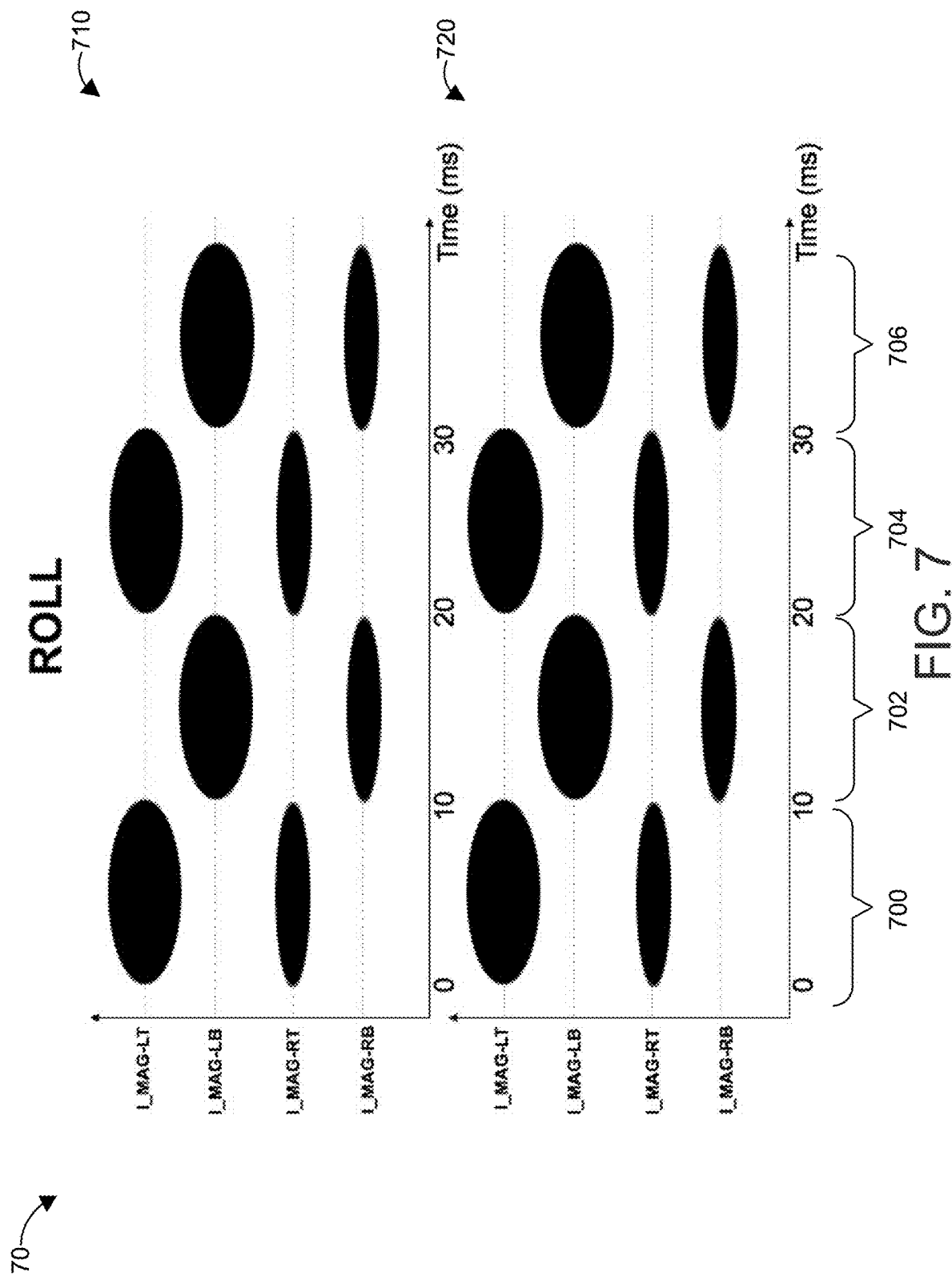
FIG. 7 is a schematic illustration of the current flowing through the inductors in the LC circuits of front and rear apparatuses in the assembly illustrated in FIG. 4 to perform a roll action during flight.

FIG. 7 is a schematic illustration 70 of the I_MAG current flowing through the inductors in the LC circuits of front and rear apparatuses 400A, 400B in assembly 40 to perform a roll action during flight. Schematic 710 illustrates the I_MAG current flowing through the inductors in the LC circuits of apparatus 400A. Schematic 720 illustrates the I_MAG current flowing through the inductors in the LC circuits of apparatus 400B. Each apparatus 400A, 400B has lower and upper electromagnetic actuator assemblies 300A, 300B, and 300C, 300D, respectively, as discussed above. The current flowing through the LC circuit in the left lower electromagnetic actuator assembly 300A corresponds to I_MAG-LB. The current flowing through the LC circuit in the right lower electromagnetic actuator assembly 300B corresponds to I_MAG-RB. The current flowing through the LC circuit in the left upper electromagnetic actuator assembly 300C corresponds to I_MAG-LT. The current flowing through the LC circuit in the right upper electromagnetic actuator assembly 300D corresponds to I_MAG-RT.

To perform a roll action in flight, the controller controls the gate voltages $V_g$ for the electromagnetic actuator assemblies 300A-D in front apparatus 400A such that I_MAG-LT and I_MAG-RT flows through the LC circuits in the left and right upper electromagnetic actuator assemblies 300C, 300D during time periods 700 and 704, and the magnitude of I_MAG-RT is smaller (e.g., about 25% to about 50%) than the magnitude of I_MAG-LT. No current flows through the LC circuits in the left and right lower electromagnetic actuator assemblies 300A, 300B during time periods 700 or 704. Next, during time periods 702 and 706, the controller controls $V_g$ so that I_MAG-LB and I_MAG-RB flows through the LC circuits in the left and right lower electromagnetic actuator assemblies 300A, 300B, and the magnitude of I_MAG-RB is smaller (e.g., about 25% to about 50%) than the magnitude of I_MAG-LB. No current flows through the LC circuits in the left and right upper electromagnetic actuator assemblies 300C, 300D during time periods 702 or 706.

The controller controls the gate voltage $V_g$ for the electromagnetic actuator assemblies 300A-D in rear apparatus 400B in the same way as in front apparatus 400A.

Thus, the roll action occurs by flowing more current in the left electromagnetic actuator assemblies 300A, 300C than in the right electromagnetic actuator assemblies 300B, 300D. The difference in current makes the wings 320 in assembly 40 "flap" harder on the left than on the right.

FIG. 8 is a schematic illustration 80 of the I_MAG current flowing through the inductors in the LC circuits of front and rear apparatuses 400A, 400B in assembly 40 to increase pitch during flight. Schematic 810 illustrates the I_MAG current flowing through the inductors in the LC circuits of apparatus 400A. Schematic 720 illustrates the I_MAG current flowing through the inductors in the LC circuits of apparatus 400B.

As can be seen, the pitch is increased by flowing more current in the LC circuits of electromagnetic actuator assemblies 300A-D in the front apparatus 400A (schematic 810) than in the rear apparatus 400B (schematic 820). The difference in current makes the wings 320 in assembly 40 "flap" harder in the front than in the back.

The pitch can be decreased by adjusting the I_MAG current such that the wings 320 in assembly 40 "flap" harder in the back than in the front.

FIG. 9 is a schematic illustration 90 of the I_MAG current flowing through the inductors in the LC circuits of front and rear apparatuses 400A, 400B in assembly 40 to change yaw during flight. Schematic 910 illustrates the I_MAG current flowing through the inductors in the LC circuits of apparatus 400A. Schematic 920 illustrates the I_MAG current flowing through the inductors in the LC circuits of apparatus 400B.

As can be seen, the yaw is changed by (a) flowing more current in the LC circuits of electromagnetic actuator assemblies 300A, 300C on the left of front apparatus 400A than in the LC circuits of electromagnetic actuator assemblies 300B, 300D on the right of front apparatus 400A (schematic 910) and (b) flowing more current in the LC circuits of electromagnetic actuator assemblies 300B, 300D on the right of rear apparatus 400B than in the LC circuits of electromagnetic actuator assemblies 300A, 300C on the left of rear apparatus 400B (schematic 920). The difference in current makes the wings 320 in assembly 40 "flap" harder in the front left and rear right than in the front right and rear left.

Alternatively, the I_MAG current can flow with the left and right sides reversed such that the wings 320 in assembly 40 "flap" harder in the front right and rear left than in the front left and rear right.

In another embodiment, all wings 320 "flap" with equal intensity in the front and rear of assembly 40. This provides a level flight without rolling, pitching, or yawing. The intensity of the "flapping" can be increased to accelerate and decreased to decelerate.

It is noted that the I_MAG currents illustrated in FIGS. 7-9 have current amplitude profiles that appear as ovals (e.g., the current amplitude gradually transitions at the beginning and ending of each time period) but other amplitude profiles can be used. For example, some or all of the I_MAG currents can have a step increase or decrease at the begging or end of a time period.

FIG. 10 is a flow chart 1000 of a method for operating an electromagnetic actuator apparatus according to one or more embodiments. The electromagnetic actuator apparatus can be the same as or different than apparatus 30 and/or assembly 40. In step 1010, a first magnetic field is generated by a first inductor. The first inductor is disposed on top of a first multilevel wiring network, which is disposed on a first semiconductor substrate. The first magnetic field is generated by flowing electrical current through the first inductor. The electrical current can be turned on and off to controllably generate the first magnetic field. In some embodiments, the first inductor is electrically disposed in parallel with a capacitor to form a first LC circuit.

In step 1020, a ferromagnetic actuator is electromagnetically attracted to the first inductor by the first magnetic field. The ferromagnetic actuator is disposed above the first inductor. In addition, the ferromagnetic actuator can be magnetically coupled to the first inductor in some embodiments.

In step 1030, the ferromagnetic actuator is transitioned from a first state to a second state. In the second state, a portion of the ferromagnetic actuator is disposed closer to the first inductor than it is in the first state. For example, the ferromagnetic actuator can pivot or rotate about a first end such that a second end of the ferromagnetic actuator pivots or rotates toward the first inductor. In another example, the ferromagnetic actuator can bend or deform towards the first inductor.

In step 1040, a second magnetic field is generated by a second inductor. The second inductor is disposed on top of a second multilevel wiring network, which is disposed on a second semiconductor substrate. The second magnetic field is generated by flowing electrical current through the second inductor. The electrical current can be turned on and off to controllably generate the second magnetic field. In some embodiments, the second inductor is electrically disposed in parallel with a capacitor to form a second LC circuit.

In step 1050, the ferromagnetic actuator is electromagnetically attracted to the second inductor by the second magnetic field. The ferromagnetic actuator is disposed below the second inductor. For example, the first and second inductors can be disposed between the first and second semiconductor substrates. In addition, the ferromagnetic actuator can be magnetically coupled to the second inductor in some embodiments.

In step 1060, the ferromagnetic actuator is transitioned from the first or second state to a third state. In the third state, the portion of the ferromagnetic actuator is disposed closer to the second inductor than it is in the first or second state. For example, the ferromagnetic actuator can pivot or rotate about a first end such that a second end of the ferromagnetic actuator pivots or rotates toward the second inductor. In another example, the ferromagnetic actuator can bend or deform towards the second inductor.

During steps 1010-1030, the electrical current for the second inductor is turned off so that the second inductor does not generate the second magnetic field. As a result, the ferromagnetic actuator is only attracted by the first magnetic field. During steps 1040-1060, the electrical current for the first inductor is turned off so that the first inductor does not generate the first magnetic field. As a result, the ferromagnetic actuator is only attracted by the second magnetic field.

Steps 1010-1030 and steps 1040-1060 can be repeated at a predetermined frequency to cause the ferromagnetic actuator to alternatively move towards the first and second inductors at the predetermined frequency. The predetermined frequency can correspond to a resonance frequency of the ferromagnetic actuator and/or of a structure attached to the ferromagnetic actuator such as an artificial appendage (e.g., a wing, a leg, etc.).

The invention should not be considered limited to the particular embodiments described above, but rather should be understood to cover all aspects of the invention as fairly set out in the attached claims. Various modifications, equivalent processes, as well as numerous structures to which the invention may be applicable, will be apparent to those skilled in the art to which the invention is directed upon review of this disclosure. The claims are intended to cover such modifications and equivalents.

What is claimed is:

1. An apparatus comprising:
a semiconductor device comprising:
a semiconductor substrate;
a multilevel wiring network disposed on the semiconductor substrate; and
an inductor comprising a ferromagnetic core, the inductor integrated on top of the multilevel wiring network;
an insulator layer disposed on the semiconductor substrate, the multilevel wiring network and the inductor formed in the insulator layer; and
a contact structure disposed on top of the insulator layer; and
a ferromagnetic actuator magnetically coupled to the inductor, the ferromagnetic actuator having a first end mechanically attached to the contact structure,
wherein:
the inductor generates a magnetic field that causes the ferromagnetic actuator to transition from a first state to a second state,
the contact structure electrically contacts the ferromagnetic actuator, and
when the ferromagnetic actuator is in the first state, a gap is formed between a top surface of the insulator layer and a second end of the ferromagnetic actuator, the gap defined by the contact structure,
when the ferromagnetic actuator is in the second state, the second end of the ferromagnetic actuator is located closer to the inductor than in the first state.

2. The apparatus of claim 1, wherein the ferromagnetic actuator comprises a magnetic cantilever.

3. The apparatus of claim 1, wherein:
the magnetic cantilever is elongated along an axis,
in the first state, the axis is parallel to a principal plane of the ferromagnetic core, and
in the second state, the axis is angled with respect to the principal plane.

4. The apparatus of claim 1, further comprising an artificial appendage mechanically coupled to a second end of the ferromagnetic actuator.

5. The apparatus of claim 4, wherein the artificial appendage comprises a wing.

6. The apparatus of claim 1, further comprising a capacitor electrically disposed in parallel with the inductor to form an LC circuit.

7. The apparatus of claim 6, further comprising a semiconductor switch that is electrically coupled to the LC circuit.

8. The apparatus of claim 7, wherein the semiconductor switch has a first state in which electrical current flows into the LC circuit and a second state in which no electrical current flows into the LC circuit.

9. The apparatus of claim 8, wherein when the semiconductor switch is in the first state, an alternating current flows through the LC circuit, the alternating current causing the inductor to generate the magnetic field.

10. The apparatus of claim 1, wherein the contact structure is configured to apply a voltage between the ferromagnetic actuator and the inductor to create an electrostatic force therebetween, the electrostatic force controlling a movement of the ferromagnetic actuator.

* * * * *